US006590438B1

(12) United States Patent
Manku et al.

(10) Patent No.: US 6,590,438 B1
(45) Date of Patent: Jul. 8, 2003

(54) INTEGRATED CIRCUIT ADJUSTABLE RF MIXER

(75) Inventors: Tajinder Manku, Kitchener (CA); Yang Ling, Waterloo (CA)

(73) Assignee: SiRiFIC Wireless Corporation, Waterloo (CA)

( * ) Notice: Subject to any disclaimer, the term of this patent is extended or adjusted under 35 U.S.C. 154(b) by 0 days.

(21) Appl. No.: 10/096,118

(22) Filed: Mar. 8, 2002

(51) Int. Cl.[7] ................................................. G11B 7/00

(52) U.S. Cl. ...................... 327/359; 327/356; 455/333

(58) Field of Search ............................. 327/355, 359, 327/356, 427, 437; 455/333, 326; 330/273, 254

(56) References Cited

U.S. PATENT DOCUMENTS

| | | | |
|---|---|---|---|
| 5,649,288 A | | 7/1997 | De Loe, Jr. et al. .......... 455/89 |
| 5,805,988 A | * | 9/1998 | Clayton et al. .............. 455/333 |
| 5,867,778 A | * | 2/1999 | Khoury et al. .............. 455/333 |
| 6,040,731 A | * | 3/2000 | Chen et al. .................. 327/359 |
| 6,069,866 A | * | 5/2000 | Pietruszynski et al. ...... 330/254 |
| 6,185,418 B1 | | 2/2001 | MacLellan et al. ......... 455/418 |

* cited by examiner

Primary Examiner—Dinh T. Le
(74) Attorney, Agent, or Firm—Gardner Groff, P.C.

(57) ABSTRACT

The invention describes improvements to a balanced active demodulator subsystem implemented in Radio Frequency integrated circuit technology that simplify the configuration and set-up of a balanced demodulator section and reduce the labor and time required during manufacture to adjust the demodulation characteristics for optimum performance. The subsystem allows for the selection of various combinations of components during use, during configuration and set-up, or during both phases, and comprises a mixer, a plurality of parallel RF balanced amplifier input stages operationally connected to the mixer, a first set of switches arranged to permit the independent selection and making operable one of the RF balanced amplifier stages, a number of pairs of current sources arranged to provide bias currents for the RF balanced amplifier input stages to reduce the current required to be passed through the balanced demodulator section; and a second set of switches arranged to permit the independent selection and making operable one of said pairs of current sources. The invention provides a balanced demodulator subsystem suitable for use in products in which cost-effectiveness is a critical factor, such as those used in personal communications.

9 Claims, 4 Drawing Sheets

INTEGRATED CIRCUIT ADJUSTABLE RF MIXER

BACKGROUND OF THE INVENTION

The present invention relates generally to communications, and more specifically to improvements in Integrated Circuits for use in Radio Frequency applications.

Many communication systems modulate electromagnetic signals from baseband to higher frequencies for transmission, and subsequently demodulate those high frequencies back to their original frequency band when they reach the receiver. The original (or baseband) signal, may be, for example, data, voice or video. These baseband signals may be produced by transducers such as microphones or video cameras, be computer generated, or transferred from an electronic storage device. In general, the high frequencies provide longer range and higher capacity channels than baseband signals, and because high frequency (HF) radio frequency (RF) signals can effectively propagate through the air, they can be used for wireless transmissions as well as hard wired or fibre channels.

All of these signals are generally referred to as RF signals, which are electromagnetic signals; that is, waveforms with electrical and magnetic properties within the electromagnetic spectrum normally associated with radio wave propagation.

Wired communication systems which employ such modulation and demodulation techniques include computer communication systems such as local area networks (LANs), point-to-point communications, and wide area networks (WANs) such as the Internet. These networks generally communicate data signals over electrically conductive or optical fibre channels. Wireless communication systems which may employ modulation and demodulation include those for public broadcasting such as AM and FM radio, and UHF and VHF television. Private communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

One of the current problems in the art is to develop effective mixers that can adapt to the varying requirements caused either by changing reception conditions, or even changing standards during the use of the device.

For cellular telephones, and similar consumer items, it is desirable to have transmitters and receivers (which may be referred to in combination as a transceiver) that can be fully integrated onto inexpensive, low power, integrated circuits (ICs).

This continuing desire to implement low-cost, power efficient receivers and transmitters has led to intensive research into the use of highly integrated designs, an increasingly important aspect for portable systems, including cellular telephone handsets. This has proven especially challenging as the frequencies of interest in the wireless telecommunications industry (especially low-power cellular/micro-cellular voice/data personal communications systems) have risen above those used previously (approximately 900 MHz) into the spectrum above 1 GHz.

Attempts to provide flexible designs in Radio Frequency Integrated Circuits (RFIC)—also known as monolithic microwave integrated circuits (MMIC)—allowing for multiple standards and varying conditions of reception have met with limited success. These designs usually provide duplication of the functions affected by these considerations. One example of prior art, U.S. Pat. No. 6,185,418 "Adaptive digital radio communication system", involves reconfiguring the system by reprogramming at least one programmable device such as a Programmable Logic Device (PLD) to perform the digital communications processing functions of the transmitter or the receiver of a radio communications system. Other implementations are related to the ability to distinguish between and cope with very different modulation schemes. One such example is given in U.S. Pat. No. 5,649,288 "Dual-function double balanced mixer circuit".

BRIEF SUMMARY OF THE INVENTION

It is known and understood in the art that the ability to deal with multiple transmission standards within a single IC design presents some difficulties in high density radio frequency integrated circuit (RF IC) technologies. These difficulties have lead circuit designers to provide separate circuit subsystems for those elements to ensure sufficiently high performance, thereby effectively introducing a degree of duplication of function. This duplication is not conducive to lower costs and reduced power consumption, important considerations in the domain of interest. The invention is especially important in the personal communications industry (low-power—cellular/micro-cellular voice/data) as the number of standards in common use has increased, and the demand for improved performance at a lower price has been met. The present invention mitigates the disadvantages of previous designs and provides other benefits, as will be apparent from the following figures and description.

The present invention provides a balanced active demodulator that simplifies the configuration and set-up of a balanced demodulator section and that reduces the labour or man-hours, and the time required during manufacture for adjusting the demodulation characteristics for optimum performance.

The present invention also provides a balanced demodulator that both decreases the number of components or parts required and lowers the fabrication cost. The invention provides a means to select various critical performance and standards parameters within a single receiver/transmitter design. It is therefore suitable for use in products in which cost-effectiveness is a critical factor such as those used in personal communications.

The circuit structure of the invention uses a single integrated circuit subsystem to replace a number of similar subsystems, each specifically designed for one standard, or designed to deal with a limited range of reception conditions. The result is that a cost-effective single design of receiver may be used in the wireless personal communication field or any other field where there are differing standards and reception requirements for a particular device or class of devices.

The invention introduces circuitry to allow various combinations of components to be selected either during use, or during configuration and set-up, or during both phases. Further, the invention comprises a number of selectable RF input stages, and a number of selectable current sources to provide bias to the selected RF input stage.

As a demonstration of the technology, the invention has been implemented as a multi-standard mixer that has been realized with a Radio Frequency Integrated Circuit (RFIC) process.

BRIEF DESCRIPTION OF DRAWINGS

The invention will now be described with reference to the following figures.

DETAILED DESCRIPTION OF THE INVENTION

This invention introduces a means to select during use a number of separate components, and their various biasing conditions and other parameters. Typically, a mixer subsystem implemented according to this invention provides the ability to deal with two or more frequency standards, and within each standard to permit the variation of bias conditions to provide near-optimal performance over a range of operational conditions (such as varying signal strength, varying levels of noise, and varying levels of interference). These bias conditions also affect the linearity of the overall mixer, so that in many cases a suitable compromise involving gain, linearity and noise must be achieved. This invention provides an enlarged choice of potential settings thereby allowing designers and users the possibility of selecting appropriate ones for improved overall performance.

Throughout the following descriptions it will be appreciated that the signals, local oscillators, and the various amplifiers and mixers being described operate in 'balanced' or differential mode, generally using a positive-going and complementary negative-going signal (or path as appropriate), not requiring or dependent on any ground reference. Although, for typical implementations, the local oscillator signals comprise a pair of sinusoidal signals bearing a quadrature relationship to one another, other types of the local oscillator signals are possible, as will be appreciated by those skilled in the art.

For convenience relevant sections of our co-pending application are included at the end of this Detailed Description. This describes the effects and advantages of providing a bias current to supplement the current passing to the gain-providing stage from the mixer stage. The present invention therefore provides a means to improve on the co-pending patent application Ser. No. 10/094,324: "Improvement to a High Linearity Gilbert I_Q Dual Mixer"—Javad Khajehpour, et al) filed concurrently herewith, the disclosure of which is incorporated herein by reference.

Figure 1:
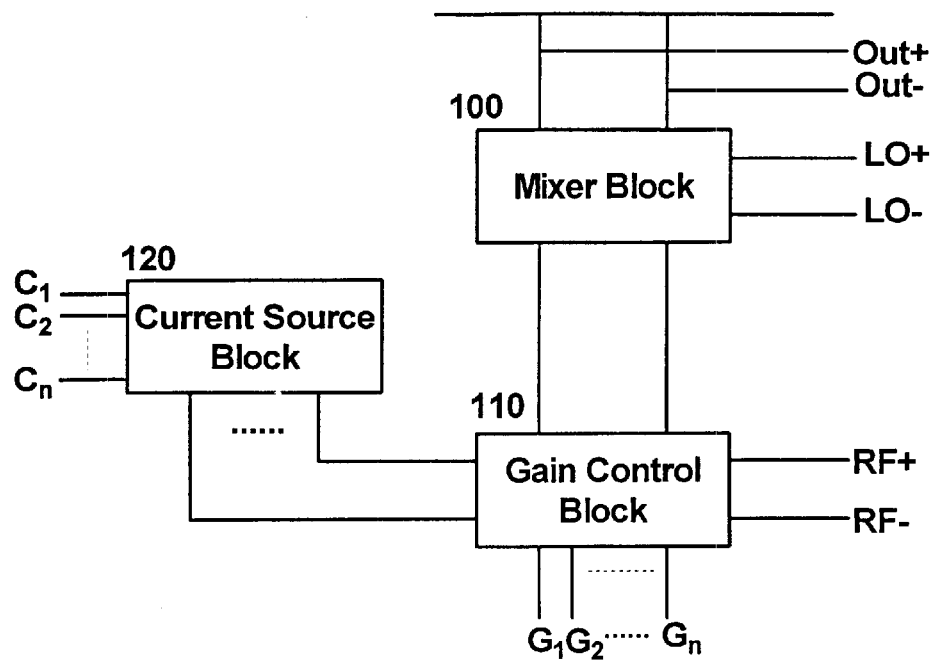
FIG. 1 is a block diagram of a preferred embodiment of the invention.

We turn now to FIG. 1, in which a first preferred embodiment or implementation of the invention is shown. The embodiment consists of a Mixer Block 100, fed with signals passing through a Gain Control Block 110, whose gain is controlled by the application of various conditions to gain control inputs in a manner described below. The conditions of operation, and hence performance, of this Gain Control Block 110 are further alterable through a Current Sources Block 120 which provides a variable amount of biasing current to the Gain Control Block 110. The amount of biasing current is controlled by the application of various conditions to current control inputs also in a manner described below.

In the figures and their descriptions following, those supplementary, subsidiary, and parasitic components which are not concerned with the operation of the invention are omitted for the sake of clarity.

Figure 2:
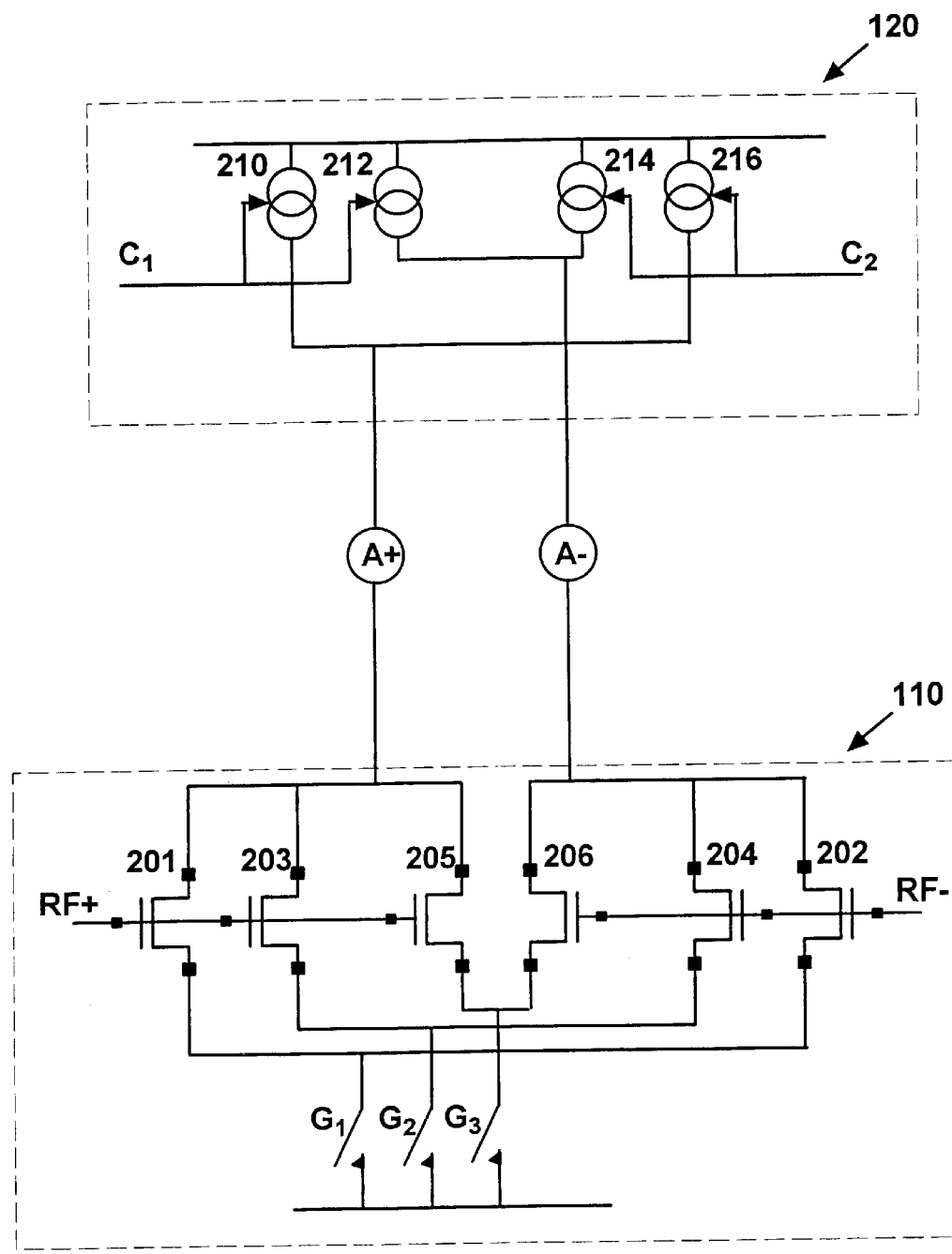

Each block shown in FIG. 1 will now be described in more detail, with reference to appropriate figures. A preferred embodiment of the Gain Control Block 110 and the Current Sources Block 120 are shown in FIG. 2. The Gain Control Block 110 is a gain-providing stage that consists of a number of pairs, in this case three pairs, of matched input transistors 201 with 202, 203 with 204, and 205 with 206. Each pair of matched input transistors is fed with the same input signal RF+, RF−, and their outputs are fed to the Mixer Block 130 as amplified signals A+, A−. The selection of the pair of matched input transistors to be used at a particular time is accomplished using switches $G_1$, $G_2$ and $G_3$ respectively. Although in the first preferred embodiment described, three possible selections are shown for the input stage, each having different biasing and other electrical performance characteristics, it will be apparent to one skilled in the art that this number might be varied during design to accommodate the differing conditions being met in a particular application. The changes to the circuitry to adjust for this varied number are obvious to one skilled in the art. In at least one preferred implementation, more than one pair of matched input stages are enabled at the same time using the switches $G_1$, $G_2$ and $G_3$. The introduction of the possibility of using multiple parallel pairs of input stages has the effect of increasing the number of possible combinations of conditions and performance available to be chosen without significantly increasing the size and complexity of the circuitry. In other preferred embodiments of the invention, the combinations of current sources selected and gain control components selected is restricted to those giving the desired beneficial results. For example, for a given selected gain control configuration, the current sources may only be permitted to provide the currents associated with fewer than the possible number of selections. Typically, the logic driving the selection of gain stages is more complex than just a simple binary tree.

FIG. 2 also shows in more detail the relationship of the Gain Control Block 110 to the Current Sources Block 120. The Current Sources Block 120 provides a means to control the amount of current fed to the Gain Control Block 110 so that this current is no longer entirely drawn from the Mixer Block 130.

The Current Sources Block 120 comprises a number of matched pairs of controllable current sources. In this case two pairs, 210 with 212, and 214 with 216, are provided. The control is limited to the ability to enable or disable a particular pair of sources, which is accomplished using the current control inputs $C_1$ and $C_2$. It is possible to select both pairs of current sources so that their combined currents are passed to the selected stages of the Gain Control Block 110, thereby providing up to three different current levels. It will be apparent to one skilled in the art that this provides even more advantage in embodiments with more than two current source pairs. For example with three current source pairs up to seven different current levels can be selected.

Figure 3:
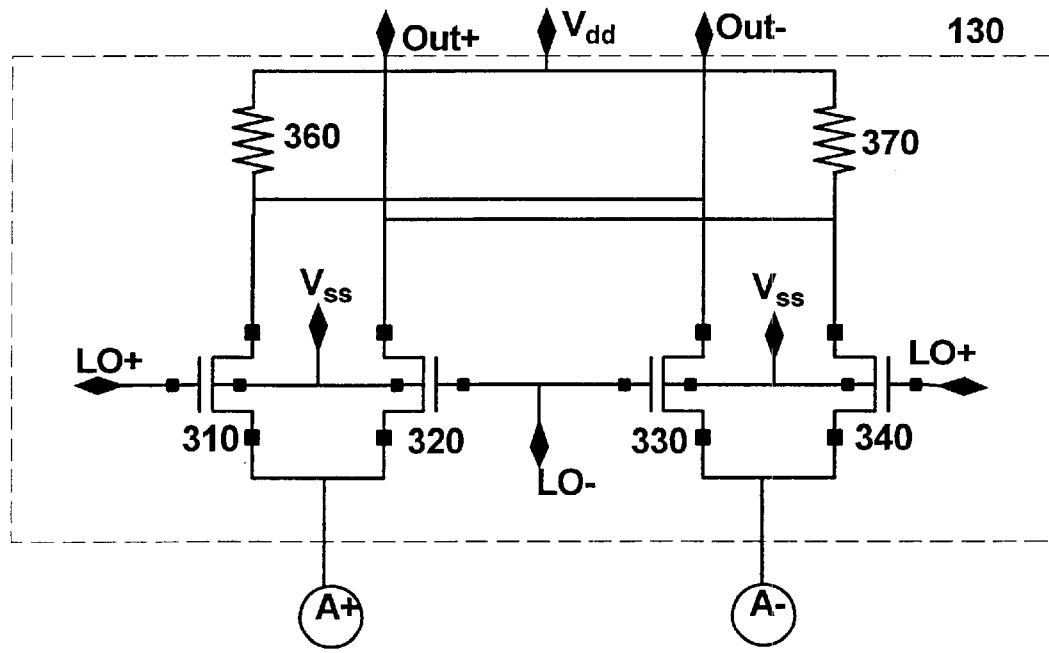
FIGS. 2 and 3 illustrate the preferred embodiment in more detail.

FIG. 3 shows the balanced mixer block 130 which accepts signals A+, A− from the Gain Control Block 110. These signals A+, A− are passed to sources of the switching transistors 310, 320 and 330, 340. The drains of transistors 310 and 330 are connected to a load resistor 360. The drains of transistors 320 and 340 are connected to a load resistor 370. The value of the load resistors 360, 370 is selected to provide the best bias conditions for the mixer transistors. The gates of the switching transistors 310 and 340 are fed with the LO+ signal, and the gates of the switching transistors 320 and 330 are fed with the LO− signal.

It is well known and understood in the art that mixer and ancillary components optimised for each of the standards can be implemented as separate subsystems and selected appropriately. The present invention not only permits optimisation to be carried out using substantially the same components in the signal path, but also allows the optimisation to be varied during operation, potentially dependent on real time measurement of performance and operating conditions such as interference and signal strength.

The benefits of the invention are most apparent when it is implemented within a single-chip design, eliminating the extra cost of interconnecting semiconductor integrated circuit devices, and reducing the overall power consumption.

The invention is applicable to those semiconductor technologies used in most consumer-intended communications devices, such as silicon. Those skilled in the art will also understand that the integrated circuit technology might be other than silicon. It is therefore the intent of the inventors to include integrated circuit technologies other than silicon, and higher frequency applications within the scope of this invention.

It will be apparent to those skilled in the art that the invention can be extended to cope with more than two or three standards, and to allow for more biasing conditions than those in the above description.

Although the invention has been described in a particular implementation of a receiver, those skilled in the art will recognise that the invention is applicable in any highly integrated semiconductor technology required to deal with multiple standards, and reception conditions, particularly, but not limited to, those frequencies exceeding 800 MHz, in situations where overall system power efficiency, and overall size of the final system are significant factors.

It is convenient to understand the requirements and operation of a High Linearity Gilbert Mixer, and to that end, the following paragraphs are included; they are extracted from the co-pending application Ser. No. 10/094,324 "Improvements to a High Linearity Gilbert I_Q Dual Mixer"_Javad Khajehpour, et al) referred to previously.

The invention provides the following advantages:

Ability to work at lower voltages

Good matching between I and Q signals.

High linearity.

Decreases the switching noise in the active mixer by reducing the switching current.

Variable conversion gain control.

These advantages are accomplished through the following features taken singly or in suitable combinations:

The combining of 'active' and 'passive' mixers in a single circuit.

The use of single input RF transistors for the I and Q signals.

The injection of a bias current between the RF transistors and their associated mixers to reduce noise in the mixer switches, yet maintain sufficient current in the associated input amplifier circuits for correct operation.

The use of simple resistive elements to fix the active mixer biasing voltages for optimum linearity.

Figure 4:
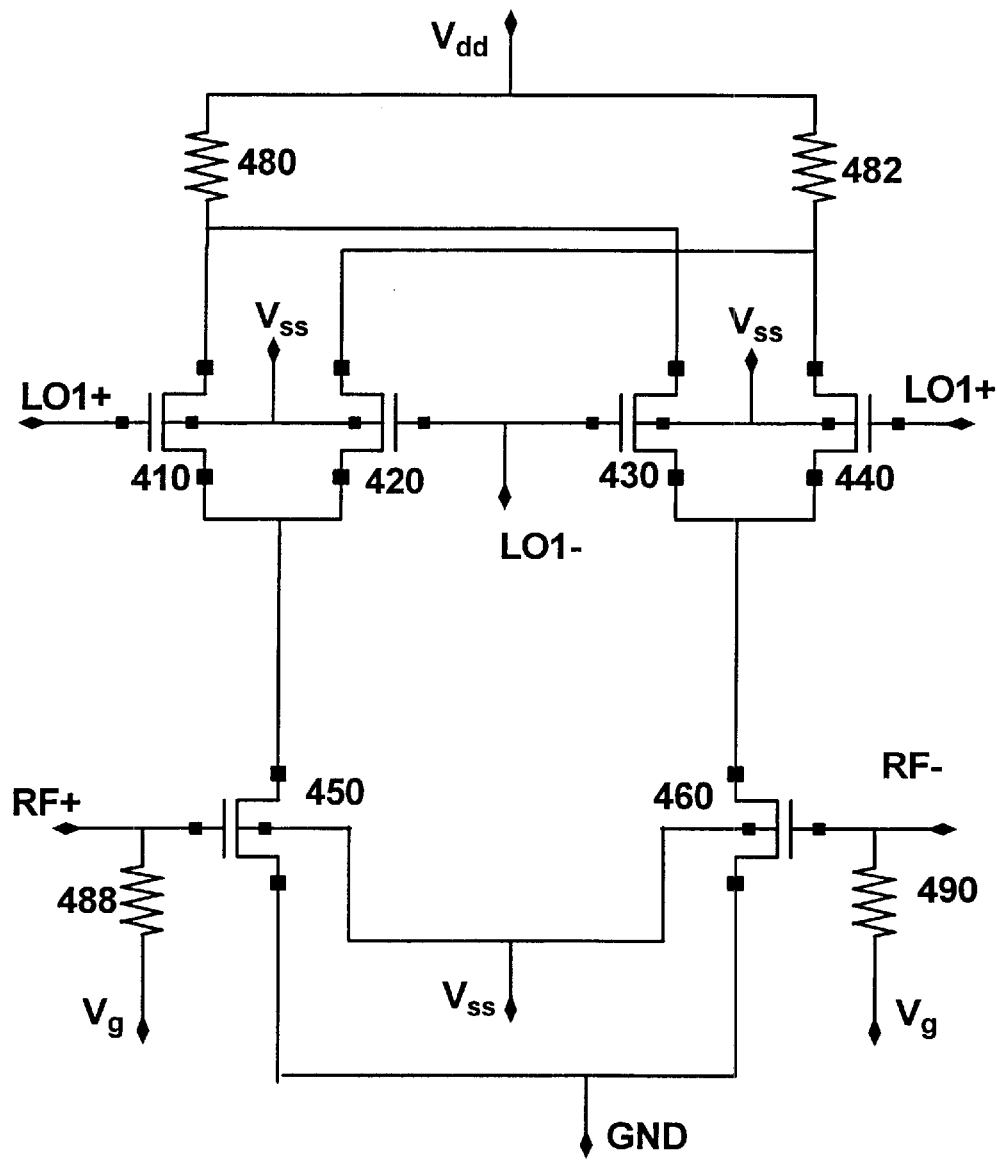
FIGS. 4 and 5 are illustrations of a particular environment, from a co-pending application, where the invention may be practised advantageously.

FIG. 4 illustrates a prior art traditional Gilbert cell multiplier or mixer circuit. As shown in FIG. 4, the circuit receives a differential voltage, RF+, RF−, as the radio frequency (RF) input signal, and a differential voltage, LO1+, LO1−, as the local oscillator (LO) signal. The differential output voltage appears between the load resistors 480, 482 in the active mixer portion of the circuit. The load resistors 480 and 482 have the same value. The circuit includes a number of Field Effect Transistors (FET) transistors, 410, 420, 430, 440, 450, and 460 which are normally biased to operate in the high gain saturation region. The RF+ signal is applied to the gate of transistor 450, and the RF− signal is applied to the gate of transistor 460, these transistors 450, 460 being coupled as a differential pair, their sources being coupled together to ground, labelled GND. The sources of transistors 410 and 420 are coupled together as a differential pair whose common connection is coupled to the drain of transistor 450. Similarly, the sources of transistors 430 and 440 are coupled together as a differential pair whose common connection is coupled to the drain of transistor 460. The gates of transistors 410 and 440 are controlled by the LO+ signal, and the gates of transistors 420 and 430 are controlled by the LO− signal. The conversion gain of the multiplier is increased as the value of the load resistors 480, 482 is increased. However, the value of the load resistors cannot merely be increased arbitrarily to any value because an increase in the resistance causes a significant DC voltage drop at the top of the cell. If only a small voltage remains at the drain of transistors 410, 420, 430 and 440, then there is insufficient voltage available to power the RF amplifier part of the circuit, transistors 450, 460. In particular, for applications where the power supply is typically set at approximately 2.7 volts to 3 volts, the drop in voltage due to large resistive values of 480 and 482 is unacceptable.

We now describe preferred embodiments of the present invention which are implemented as a modifications to a Gilbert mixer circuit to alleviate the disadvantages and problems introduced because of low voltage power supply typically found in low-power devices such as portable cellular phones. Generally, in these circumstances, the use of an active mixer results in poor linearity when using prior art designs.

Figure 5:
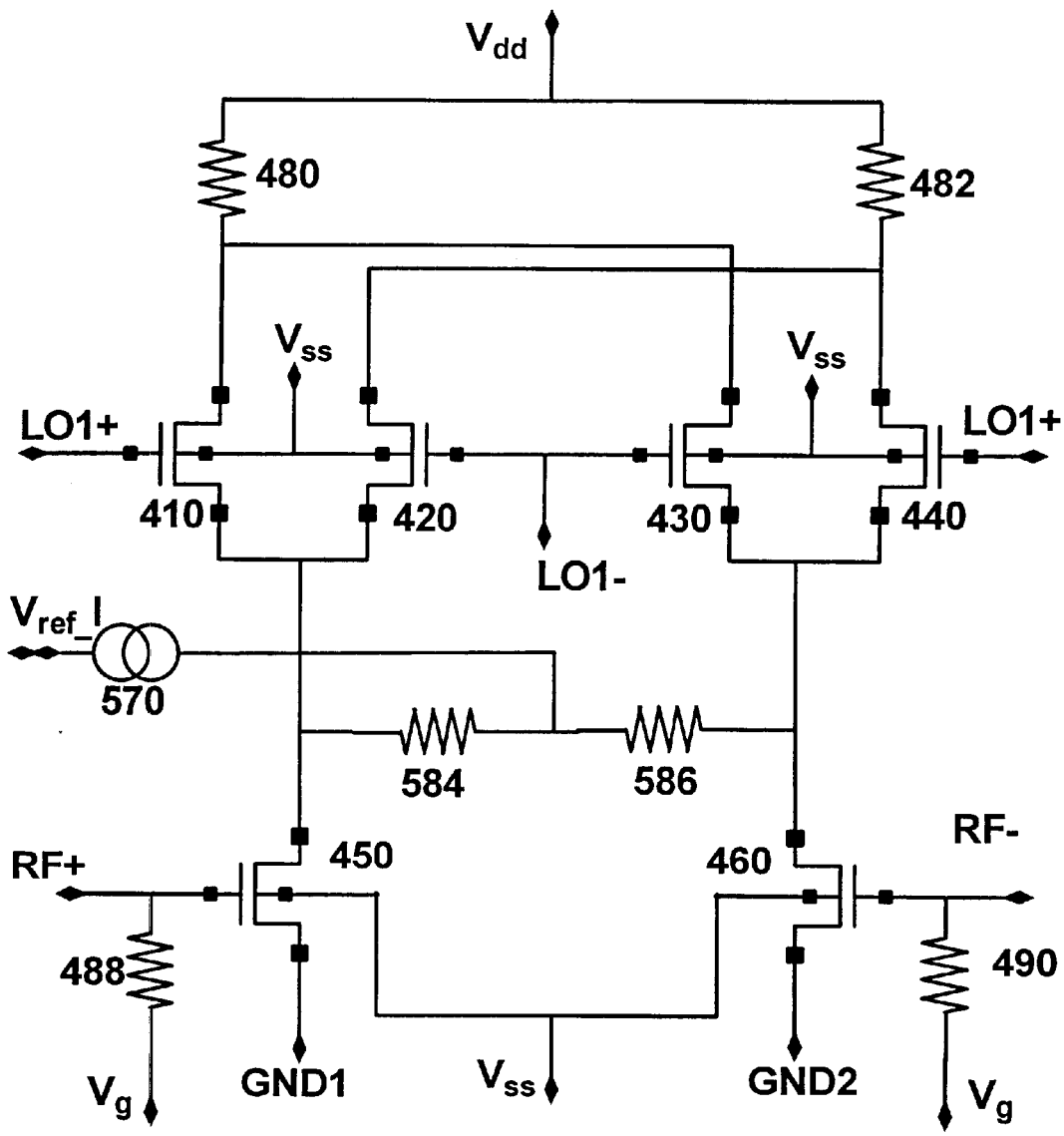

A preferred embodiment of the invention is next described with reference to a Gilbert mixer circuit as shown in FIG. 5. In this figure, the components labelled 410 to 490 perform the same functions as in FIG. 4. The extra components are next described in detail, with particular reference to their effect on the operation of the Gilbert mixer circuit. In the invention, a current injection circuit is introduced comprising a constant current source 570 and two resistors 584 and 586. This current injection circuit is arranged to provide the majority of current required by the RF amplifier transistors thereby requiring the active mixer switches to provide only a small proportion of the current required for the RF amplifier stage. As will be appreciated by those skilled in the art, the reduced contribution of current to the RF amplifier circuit, results in less noise being referred to the inputs of the active mixer input transistors and also less noise being generated by the resistive load of the active mixer circuit, resulting in improved overall noise performance. At the same time, the total current flowing through the RF amplifier transistors can be maintained at a level sufficient to ensure their operation at the required gain and linearity as further discussed below.

The resistors 584, 586 forming part of the current injection source also affect the gain of the input transistors 450, 460 which form the RF amplifier or input stage of the mixer. As will be appreciated by those skilled in the art, decreasing the value of these resistors 584, 586, reduces the conversion gain of the overall mixer circuit. Similarly, increasing the value of the resistors increases the conversion gain. The value of the resistors 584, 586 must therefore be chosen with care to provide acceptable overall noise performance and overall conversion gain.

The linearity of an active mixer is dependent on the biasing voltage of transistors. A simple voltage divider is used as the load of mixer. There are at least two sources of non linearity: First the non linearity of the RF transistors and second that of the switching transistors. The optimum biasing must be found through simulation or other techniques. The bias voltage applied to each of the drains of the active mixer switches is thereby selected and fixed to that necessary for optimum linearity during design.

What is claimed is:

1. An RF mixer subsystem for use in single and multi-standard systems and implemented in a radio frequency integrated circuit technology for use at frequencies exceeding 800 MHz, comprising:

a mixer having inputs and outputs;

a plurality of parallel RF balanced amplifier input stages operationally connected to the inputs of said mixer;

a set of switches arranged to permit independent selection of and making operable anyone of said RF balanced amplifier stages, each of the switches in said set of switches providing a connection to ground of one RF balanced amplifier stage, thereby permitting current to flow and the stage to become operational;

a plurality of pairs of current sources arranged to provide bias currents for said RF balanced amplifier input stages; and a set of control inputs arranged to permit independent selection of making operable any of said pairs of current sources.

2. The RF mixer subsystem of claim 1, wherein each of the said plurality of parallel RF balanced amplifier input stages has different electrical performance parameters or metrics, including but not limited to linearity, gain, noise figure, from the others.

3. The RF mixer subsystem of claim 1, wherein each of the said plurality of pairs of current sources has different electrical performance parameters or metrics, including but not limited to the magnitude of current provided, from others.

4. The RF mixer subsystem of claim 1, wherein the said set of switches is arranged to permit the selection of and making operable more than one of said RF balanced amplifier stages at any one time, thereby increasing the number of permissible combinations of said RF balanced amplifier stages, and permitting a greater choice of electrical performance parameters or metrics.

5. The RF mixer subsystem of claim 1, wherein said set of control inputs is arranged to permit the selection of and making operable more than one said pair of current sources at any one time, thereby increasing the number of permissible selections of current, and permitting a greater choice of electrical performance parameters or metrics.

6. The RF mixer subsystem of claim 1 wherein the radio frequency integrated circuit technology is selected from the group consisting of CMOS, Bipolar Silicon, GaAs, or any appropriate IC technology.

7. An RF mixer subsystem for use in single and multi-standard systems and implemented in a radio frequency integrated circuit technology for use at frequencies exceeding 800 MHz, comprising:

a mixer having inputs and outputs;

a plurality of parallel RF balanced amplifier input stages, each having different operating characteristics, operationally connected to the inputs of said mixer;

a set of switches arranged to permit independent selection of one or more of said RF balanced amplifier stages at any one time, each of the switches arranged to permit independent selection of one or more of said RF balanced amplifier stages at any one time, each of the switches in said set of switches providing a connection to ground of one RF balanced amplifier stage, thereby permitting current to flow and the stage to become operational, thereby increasing the number of permissible arrangements of RF balanced amplifier stages, and permitting a greater choice of operating characteristics for said RF balanced amplifier stage;

a plurality of pairs of current sources, each having different operating characteristics, arranged to provide bias currents for said selected RF balanced amplifier input stage; and a set of control inputs arranged to permit independent selection of and making operable one or more pairs of said pairs of current sources at any one time, thereby increasing the number of permissible selections of current, and permitting a greater choice of operating characteristics for said RF balanced amplifier stage.

8. A computer readable memory medium, storing computer software code in a hardware development language for fabrication of an integrated circuit comprising the RF mixer subsystem of any of claims 1 to 5.

9. A computer data signal embodied in a carrier wave, said computer data signal comprising computer software code in a hardware development language for fabrication of an integrated circuit comprising the RF mixer subsystem of any of claims 1 to 5.

* * * * *